US010242969B2

(12) United States Patent
Hohlfeld et al.

(10) Patent No.: US 10,242,969 B2
(45) Date of Patent: Mar. 26, 2019

(54) SEMICONDUCTOR PACKAGE COMPRISING A TRANSISTOR CHIP MODULE AND A DRIVER CHIP MODULE AND A METHOD FOR FABRICATING THE SAME

(71) Applicant: Infineon Technologies AG, Neubiberg (DE)

(72) Inventors: Olaf Hohlfeld, Warstein (DE); Juergen Hoegerl, Regensburg (DE); Angela Kessler, Sinzing (DE); Magdalena Hoier, Seubersdorf (DE)

(73) Assignee: Infineon Technologies AG, Neubiberg (DE)

( * ) Notice: Subject to any disclaimer, the term of this patent is extended or adjusted under 35 U.S.C. 154(b) by 6 days.

(21) Appl. No.: 14/077,696

(22) Filed: Nov. 12, 2013

(65) Prior Publication Data
US 2015/0130071 A1    May 14, 2015

(51) Int. Cl.
*H01L 25/07*   (2006.01)
*H01L 23/31*   (2006.01)
(Continued)

(52) U.S. Cl.
CPC .......... *H01L 25/074* (2013.01); *H01L 21/565* (2013.01); *H01L 23/3135* (2013.01); *H01L 23/3735* (2013.01); *H01L 23/4334* (2013.01); *H01L 23/49811* (2013.01); *H01L 23/49827* (2013.01); *H01L 23/5386* (2013.01); *H01L 23/5389* (2013.01); *H01L 25/50* (2013.01); *H01L 21/566* (2013.01); *H01L 2924/0002* (2013.01)

(58) Field of Classification Search
CPC . H01L 25/0657; H01L 25/074; H01L 25/043; H01L 25/0756; H01L 25/117; H01L 25/5384; H01L 21/4853; H01L 21/486; H01L 21/49811; H01L 21/49827; H01L 2224/32145; H01L 2224/32146; H01L 23/3135; H05K 5/065; H05K 1/18; H05K 1/181
USPC ........................................................ 257/286
See application file for complete search history.

(56) References Cited

U.S. PATENT DOCUMENTS 5,519,252 A * 5/1996 Soyano ................... H01L 21/56
257/177
6,344,973 B1 * 2/2002 Feustel ................. H01L 25/162
174/255

(Continued)

FOREIGN PATENT DOCUMENTS

CN      102142401 A      8/2011
DE      102008052029 A1  6/2009

*Primary Examiner* — David Spalla
(74) *Attorney, Agent, or Firm* — Murphy, Bilak & Homiller, PLLC

(57) ABSTRACT

A semiconductor package includes a first semiconductor module including a plurality of semiconductor transistor chips and a first encapsulation layer disposed above the semiconductor transistor chips, and a second semiconductor module disposed above the first semiconductor module. The second semiconductor module includes a plurality of semiconductor driver channels and a second encapsulation layer disposed above the semiconductor driver channels. The semiconductor driver channels are configured to drive the semiconductor transistor chips.

13 Claims, 5 Drawing Sheets

(51) Int. Cl.
*H01L 23/522* (2006.01)
*H01L 25/00* (2006.01)
*H01L 21/56* (2006.01)
*H01L 23/373* (2006.01)
*H01L 23/433* (2006.01)
*H01L 23/538* (2006.01)
*H01L 23/498* (2006.01)

(56) References Cited

U.S. PATENT DOCUMENTS

| | | | |
|---|---|---|---|
| 6,421,244 B1* | 7/2002 | Shinohara | H01L 23/24 257/E23.14 |
| 6,618,267 B1* | 9/2003 | Dalal | H01L 23/5385 257/E23.114 |
| 7,598,606 B2 | 10/2009 | Chow et al. | |
| 7,791,177 B2 | 9/2010 | Wieneke Kessler et al. | |
| 8,072,058 B2* | 12/2011 | Kim et al. | 257/691 |
| 8,604,610 B1 | 12/2013 | Hughes | |
| 8,692,387 B2 | 4/2014 | Qiu et al. | |
| 2004/0113253 A1* | 6/2004 | Karnezos | H01L 21/563 257/686 |
| 2004/0150064 A1* | 8/2004 | Rissling et al. | 257/434 |
| 2006/0097380 A1* | 5/2006 | Sato | 257/706 |
| 2008/0006925 A1* | 1/2008 | Yim | H01L 23/3128 257/686 |
| 2010/0225005 A1* | 9/2010 | Nishio et al. | 257/774 |
| 2011/0215460 A1* | 9/2011 | Otremba | H01L 21/561 257/690 |
| 2011/0298106 A1* | 12/2011 | Kim et al. | 257/659 |
| 2012/0080786 A1* | 4/2012 | Furutani | H01L 21/568 257/737 |
| 2012/0181624 A1* | 7/2012 | Cho | H01L 23/49524 257/401 |
| 2013/0026651 A1* | 1/2013 | Oh | H01L 25/105 257/774 |
| 2013/0071969 A1* | 3/2013 | Vodrahalli | H01L 25/0657 438/107 |
| 2013/0240909 A1* | 9/2013 | Hiramatsu | H01L 23/24 257/77 |
| 2015/0243640 A1* | 8/2015 | Horio | H01L 23/3107 257/701 |
| 2015/0279768 A1* | 10/2015 | Rathbun | H01L 23/49811 174/251 |

* cited by examiner

SEMICONDUCTOR PACKAGE COMPRISING A TRANSISTOR CHIP MODULE AND A DRIVER CHIP MODULE AND A METHOD FOR FABRICATING THE SAME

TECHNICAL FIELD

Examples described herein generally relate to semiconductor packages and, more particularly, to semiconductor packages such as those employed in power converter circuits, and to a method for fabricating a semiconductor package.

BACKGROUND

In many electronic systems it is necessary to employ converters like DC/DC converters, AC/DC converters, DC/AC converters, or frequency converters in order to generate the currents, voltages and/or frequencies to be used by an electronic circuit, like, for example, a motor driving circuit. The converter circuits as mentioned before typically comprise one or more half-bridge circuits, each provided by two semiconductor power switches, such as e.g. power MOSFET devices, and further components such as diodes connected in parallel to the transistor devices, and passive components such as an inductance and a capacitance. The switching of the power MOSFET devices can be controlled by one or more semiconductor driver chips. The assembly of the converter circuit and the assembly of semiconductor driver chips and also the individual components incorporated in these assemblies can in principle be provided as individual components which are mounted on a printed circuit board (PCB). There is, however, a general tendency to save space on the PCB and therefore to provide integrated semiconductor devices having short interconnections between the individual components to reduce switching losses and parasitic inductances.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description. The elements of the drawings are not necessarily to scale relative to each other. Like reference numerals designate corresponding similar parts.

DETAILED DESCRIPTION

Figure 1:
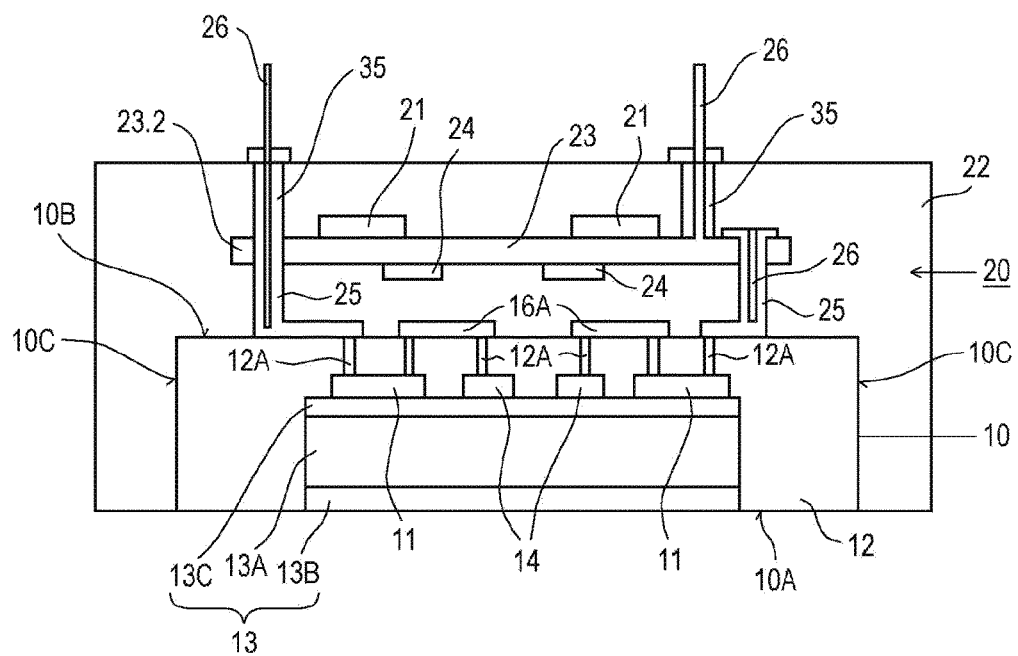
FIG. 1 shows a schematic cross-sectional side view representation of a semiconductor package according to an example.

The aspects and examples are now described with reference to the drawings, wherein like reference numerals are generally utilized to refer to like elements throughout. In the following description, for purposes of explanation, numerous specific details are set forth in order to provide a thorough understanding of one or more aspects of the examples. It may be evident, however, to one skilled in the art that one or more aspects of the examples may be practiced with a lesser degree of the specific details. In other instances, known structures and elements are shown in schematic form in order to facilitate describing one or more aspects of the examples. It is to be understood that other examples may be utilized and structural or logical changes may be made without departing from the scope of the present invention. It should be noted further that the drawings are not to scale or not necessarily to scale.

In the following detailed description, reference is made to the accompanying drawings, which form a part hereof, and in which is shown by way of illustration specific aspects in which the invention may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The examples of a semiconductor package and a method for fabricating a semiconductor package may use various types of transistor devices. The examples may use transistor devices embodied in semiconductor dies or semiconductor chips wherein the semiconductor dies or semiconductor chips may be provided in a form of a block of semiconducting material as fabricated from a semiconductor wafer and diced out from the semiconductor wafer, or in another form in which further process steps have been carried out like, for example, applying an encapsulation layer to the semiconductor die or semiconductor chip. The examples may also use horizontal or vertical transistor devices wherein those structures may be provided in a form in which all contact elements of the transistor device are provided on one of the main faces of the semiconductor die (horizontal transistor structures) or in a form in which at least one electrical contact element is arranged on a first main face of the semiconductor die and at least one other electrical contact element is arranged on a second main face opposite to the main face of the semiconductor die (vertical transistor structures) like, for example, MOS transistor structures or IGBT (Insulated Gate Bipolar Transistor) structures. Insofar as the transistor chips are configured as power transistor chips, the examples of a semiconductor package disclosed further below can be classified as intelligent power modules (IPM).

In any case the semiconductor dies or semiconductor chips may comprise contact elements or contact pads on one or more of their outer surfaces wherein the contact elements serve for electrically contacting the semiconductor dies. The contact elements may have any desired form or shape. They can, for example, have the form of lands, i.e. flat contact layers on an outer surface of the semiconductor die. The contact elements or contact pads may be made from any electrically conducting material, e.g. from a metal as aluminum, gold, or copper, for example, or a metal alloy, or an electrically conducting organic material, or an electrically conducting semiconductor material. The contact elements may also be formed as layer stacks of one or more of the above-mentioned materials.

The examples of a semiconductor package may comprise an encapsulant or encapsulating material having the semiconductor transistor chips and the semiconductor driver chips or semiconductor driver channels embedded therein. The encapsulating material can be any electrically insulating material like, for example, any kind of molding material, any kind of resin material, or any kind of epoxy material. The encapsulating material can also be a polymer material, a polyimide material, a thermoplast material, a silicone material, a ceramic material, and a glass material. The encapsulating material may also comprise any of the above-mentioned materials and further include filler materials embedded therein like, for example, thermally conductive increments. These filler increments can be made of AlO or $Al_2O_3$, AlN, BN, or SiN, for example. Furthermore the filler increments may have the shape of fibers and can be made of carbon fibers or nanotubes, for example. The examples of a semiconductor package may also comprise two different encapsulating materials, one of which having the semiconductor transistor chips embedded therein and the other one of which having the semiconductor driver chips or the semiconductor driver channels embedded therein.

FIG. 1 shows a cross-sectional side view representation of a semiconductor package according to an example. The semiconductor package 100 comprises a first semiconductor module 10 and a second semiconductor module 20 disposed above the first semiconductor module 10. The first semiconductor module 10 comprises a plurality of semiconductor transistor chips 11 and a first encapsulation layer 12 disposed above the semiconductor transistor chips 11. The second semiconductor module 20 comprises a plurality of semiconductor driver channels 21 and a second encapsulation layer 22 disposed above the semiconductor driver channels 21. The first semiconductor module 10 may comprise a first (lower) main face 10A, a second (upper) main face 10B opposite to the first main face 10A, and side faces 10C connecting the first and second main faces 10A and 10B. In case of a rectangular or cuboid shape of the first semiconductor module 10, the first semiconductor module 10 comprises four side faces 10C. As mentioned before, the second semiconductor module 20 is disposed above the first semiconductor module. As shown in FIG. 1, "above" can have a meaning that the second encapsulation layer 22 of the second semiconductor module 20 covers the first encapsulation layer 12 on its second main face 10B and on its side faces 10C, in particular is directly attached to the second main face 10B and the side faces 10C, and the lower surface of the second encapsulation layer 22 is flush with the first main face 10A of the first semiconductor module 10. "Above" can also have a different meaning, namely that the second encapsulation layer 22 of the second semiconductor module 20 only covers the second main face 10B but not the side faces 10C of the first semiconductor module 10.

It should be mentioned further that the semiconductor driver channels 21 are depicted in FIG. 1 as separate components and in fact the semiconductor driver channels 21 can be provided as corresponding separate semiconductor driver chips 21. However, it is also possible to provide one single semiconductor driver chip and integrate therein a plurality of semiconductor driver channels 21. For the purpose of this application the terms "semiconductor driver channels 21" and "semiconductor driver chips 21" are meant to be interchangeable in the above sense.

The semiconductor driver chips 21 are configured to drive the semiconductor transistor chips 11. In particular, the semiconductor driver chips 21 are connected to the semiconductor transistor chips 11, in particular to control electrodes, i.e. gate electrodes, of the semiconductor transistor chips 11.

According to an example of the semiconductor package 100 of FIG. 1, the first semiconductor module 10 comprises a carrier 13. According to an example the carrier 13 comprises a substrate 13A comprising an insulating, dielectric or ceramic layer or tile, and a first metallic layer 13B on a lower surface of the substrate 13A and a second metallic layer 13C on an upper surface of the substrate 13A. According to an example the carrier 13 may comprise one or more of a direct copper bonded (DCB) substrate, a direct aluminum bonded (DAB) substrate, and an active metal brazing substrate, wherein the substrate may comprise a ceramic layer, in particular one or more of AlO, AlN, $Al_2O_3$, or a dielectric layer, in particular $Si_3N_4$. According to an example, the carrier 13 may comprise a first upper surface, a second lower surface opposite to the first upper surface, and side faces connecting the first and second surfaces, wherein the first encapsulation layer 12 may cover the first upper surface and the side faces of the carrier 13. According to an example, the carrier 13 may comprise a substrate 13A which may be an inorganic or an organic substrate. The core of the substrate 13A, in particular of the organic substrate, may comprise a thermal conductivity better than 1 W/mK. According to an example, the carrier 13 may comprise a thickness in a range from 0.1 mm to 0.3 mm, in particular in a range from 0.15 mm to 0.25 mm.

According to an example of the semiconductor package 100 of FIG. 1, the first semiconductor module 10 further comprises a plurality of semiconductor diode chips 14, which can be configured as flyback diodes. According to an example, each one of the semiconductor transistor chips 11 is connected with one of the semiconductor diode chips 14 in parallel. According to an example, the first semiconductor module 10 further comprises a metallization layer 16 comprising a plurality of metallic areas 16A forming electrical connections between selected ones of the semiconductor transistor chips 11 and the semiconductor diode chips 14. In addition the first encapsulation layer 12 may comprise via connections 12A connecting the metallic areas 16A with selected ones of the semiconductor transistor chips 11 and the semiconductor diode chips 14. The via connections 12A will be described in more detail below, in particular they may comprise lateral diameters greater than 50 μm.

According to an example of the semiconductor package 100 of FIG. 1, the semiconductor transistor chips 11 and the semiconductor diode chips 14 are connected to form an AC/AC converter circuit, an AC/DC converter circuit, a DC/AC converter circuit, a frequency converter, or a DC/DC converter circuit.

According to an example of the semiconductor package 100 of FIG. 1, one or more of the semiconductor transistor chips 11 and the semiconductor diode chips 14 comprise a thickness in a range from 5 µm to 700 µm, in particular from 30 µm to 100 µm, in particular from 50 µm to 80 µm.

According to an example of the semiconductor package 100 of FIG. 1, the semiconductor transistor chips 11 each comprise one or more of a power transistor, a vertical transistor, an MOS transistor, and an insulated gate bipolar transistor (IGBT). According to an example, the semiconductor material of one or more of the semiconductor transistor chips 11 and the semiconductor diode chips 14 may be based on Si, GaN, SiC or any other semiconductor material.

According to an example of the semiconductor package 100 of FIG. 1, the encapsulation layer 12 comprises a thickness in a range from 0.05 mm to 1.5 mm above the upper surface of the carrier 13. According to an example, the first encapsulation layer 12 may comprise a thickness in a range from 200 µm to 300 µm above the first, upper main face of the semiconductor transistor chips 11.

The semiconductor package 100 may be configured in two different variants with respect to the first semiconductor module 10. Reference is made in this respect to U.S. patent application Ser. No. 13/974,583 (the "prior patent application") of one and the same Assignee as the present application, wherein the disclosure of the prior patent application is incorporated in its entirety into the present application. A first variant maybe entitled "common DCB approach" and is represented by FIG. 1 of the present application wherein the first semiconductor module 10 comprises one contiguous carrier 13 enclosed at five sides (four side faces and the top main face) by the first encapsulation layer 12. In particular such a first semiconductor module 10 may comprise six semiconductor power transistors, in particular six IGBT transistors, and six semiconductor diodes. A second variant maybe entitled "segmented DCB approach" wherein the first semiconductor module comprises a number of separate modules such as those shown in FIG. 5 of the prior patent application. These separate modules may each be constructed in the same way as the first semiconductor module 10 shown in FIG. 1, namely a carrier 13 embedded in a first encapsulation layer 12, wherein the number of separate modules are separated from each other by the second encapsulation layer 22 so that as a result each one of the separate modules is covered on all five sides (four side faces and one top face) by the second encapsulation layer 22.

According to an example of the semiconductor package 100 of FIG. 1, one or more of the first encapsulation layer 12 and the second encapsulation layer 22 comprises one or more of a polymer material, a mold compound material, a resin material, an epoxy-resin material, an acrylate material, a polyimide material, and a silicone-based material. According to an example, the first and second encapsulation layers 12 and 22 comprise different materials.

According to an example of the semiconductor package 100 of FIG. 1, the first encapsulation layer 12 comprises via connections 12A connecting the metallic areas 16A of the metallization layer 16 with selected ones of the semiconductor transistor chips 11 and the semiconductor diode chips 14. The via connections 12A may comprise lateral diameters in a range from 0.05 mm to 1 mm, in particular from 0.3 mm to 0.7 mm. According to an example, the via connections 12A comprise a ratio of height to width in a range from 0 to 3, preferably in a range from 0.3 to 3.

According to an example of the semiconductor package 100 of FIG. 1, the via connections 12A comprise via holes through the encapsulation layer 12, the via holes being filled completely or in part with an electrically conducting material like, for example, a metal as, for example, copper. The electrically conducting material can be filled into the via holes in such a way that the via holes are not completely filled by the material but instead the material only covers the walls of the via holes with a thickness less than half the diameter of the via holes.

According to an example of the semiconductor package 100 of FIG. 1, the first semiconductor module 10 comprises one or more half-bridge circuits wherein in each half-bridge circuit two semiconductor transistor chips 11 are connected in series. In particular, the first semiconductor module 10 may comprise six semiconductor transistor chips 11 wherein two respective semiconductor transistor chips 11 are connected in series to form three half-bridge circuits.

According to an example of the semiconductor package 100 of FIG. 1, each one of the semiconductor transistor chips 11 is connected with one of the semiconductor diode chips 14 in parallel. In particular, the first semiconductor module 10 may comprise six semiconductor transistor chips 11 and six semiconductor diode chips 14 each of them connected in parallel to one of the semiconductor transistor chips 11.

According to an example of the semiconductor package 100 of FIG. 1, the second semiconductor module 20 comprises a printed circuit board 23 and the semiconductor driver chips 21 are connected to the printed circuit board 23. According to an example, the printed circuit board 23 is disposed in a distance from the first semiconductor module 10, and the second encapsulation layer 22 is disposed in an intermediate space between the printed circuit board 23 and the first semiconductor module 10. According to an example, the printed circuit board 23 is completely embedded within the second encapsulation layer 22.

According to an example of the semiconductor package 100 of FIG. 1, the semiconductor driver chips 21 can be connected only on an upper surface of the printed circuit board 23. It is also possible that the semiconductor driver chips 21 are only connected to the lower surface of the printed circuit board 23. It is also possible that the semiconductor driver chips 21 are connected on both the upper and the lower surfaces of the printed circuit board 23.

According to an example of the semiconductor package 100 of FIG. 1, the second semiconductor module 20 comprises a plurality of passive devices 24 like, for example, resistors, capacitors, inductors and the like. According to an example, the passive devices 24 can be connected only to a lower surface of the printed circuit board 23. They also can be connected only to an upper surface of the printed circuit board 23. A further possibility is that the passive devices 24 can be connected to the lower surface as well as to the upper surface of the printed circuit board 23.

According to an example of the semiconductor package 100 of FIG. 1, electrical connections between the first semiconductor module 10 and the second semiconductor module 20 are provided by sleeves 25 and metallic pins 26 inserted into the sleeves 25. The sleeves 25 can be embedded within the encapsulation layer 22 so that they are surrounded laterally on all sides by the second encapsulation layer 22. The sleeves 25 can have circular cross-section, for example. The printed circuit board 23 may comprise through-connectors 23.1, 23.2 at predetermined locations thereof so that, wherever necessary, an electrical through-connection can be formed by connecting a sleeve 26 with the inserted pin 25 with a through-connector 23.1, e.g. for providing an electrical connection between a semiconductor driver chip 21 connected to an upper surface of the printed circuit board 23 with a semiconductor transistor chip 11. Another through-connector 23.2, formed in the printed circuit board 23, serves for providing a through-connection from the first semiconductor module 10 to the outside of the semiconductor package 100. To this end a first sleeve 25 is connected between the first semiconductor module 10 and the through-connector 23.2 and a second sleeve 35 is connected between the through-connector 23.2 and an upper surface of the second semiconductor module 20, i.e. an upper surface of the second encapsulation layer 22. A metallic pin 26 can then be disposed inside the sleeves 25 and 35 extending from the first semiconductor module 10 to the outside of the semiconductor package 100. The sleeves 25 and 35 can also be formed integral or contiguous in the form of one sleeve. By such an electrical connection an electrical output current out of one of the half-bridge circuits may be provided, for example, or an input voltage may be supplied to one of the half-bridge circuits. Further sleeves 35 may be connected between the printed circuit board 23 and the upper surface of the second semiconductor module 20, i.e. the upper surface of the second encapsulation layer 22 as shown on the right hand side of the semiconductor package 100. By this kind of electrical connection the power supply to the second semiconductor module 20 may be provided, for example. A metallic pin 26 may be inserted into the sleeve 35 reaching from the printed circuit board 23 to the outside of the semiconductor package 100. The sleeves 35 may also be totally embedded in the second encapsulation layer 22 so that they are surrounded on all sides by the second encapsulation layer 22. The sleeves 35 may also have a circular cross-section.

Figure 2:
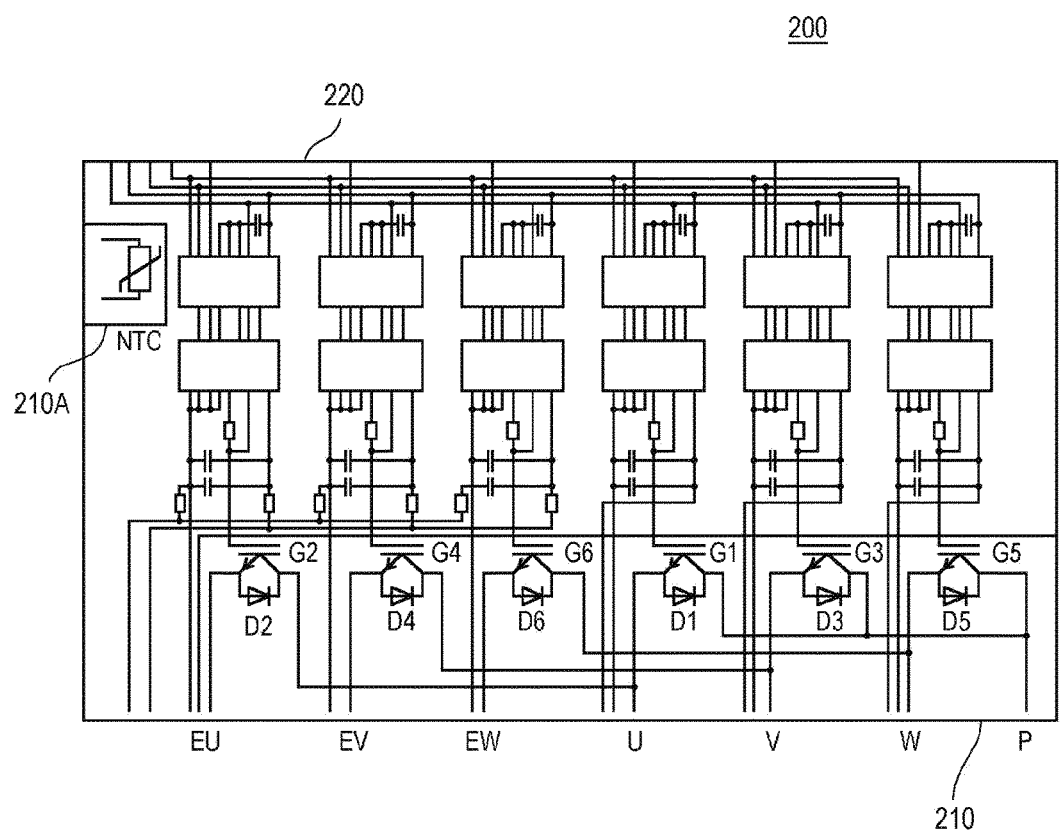
FIG. 2 shows a schematic circuit representation of a semiconductor converter circuit and a semiconductor driver circuit connected to the semiconductor converter circuit.

FIG. 2 shows an example of a circuitry which can be realized by a semiconductor package as described above. The circuit design shown in FIG. 2 represents a three-phase inverter circuit 200 for generating three-phase alternating currents which can be used, for example, for driving an electric motor. The circuit 200 comprises a transistor circuit 210 comprising six transistors G1-G6 each one of which may be connected in parallel to one of six diodes D1-D6. The transistor circuit 210 may be further divided in three half-bridge circuits, each one of the half-bridge circuits providing one phase of the three-phase currents. In particular, a first half-bridge circuit is formed by a series connection of the transistors G1 and G2 providing a first current U at a node between the transistors G1 and G2, a second half-bridge circuit is formed by a series connection of the transistors G3 and G4 providing a second current V at a node between the transistors G3 and G4, and a third half-bridge circuit is formed by a series connection of the transistors G5 and G6 providing a third current W at a node between the transistors G5 and G6. Each one of the three half-bridge circuits is provided with one of three voltages EU, EV and EW and each one of these voltages is input at a source terminal of one of the transistors of the respective half-bridge circuit. The drain contact of the respective other transistors of the half-bridge circuits are connected to one common potential P. The circuit 200 further comprises a driver circuit 220 comprising driver circuit chips. Each one of the transistors G1-G6 is driven by two driver circuit chips which are depicted vertically above the transistors G1-G6, respectively. The transistor circuit 210 may be incorporated within the first semiconductor module 10 shown in FIG. 1 and the driver circuit 220 may be incorporated within the second semiconductor module 20 shown in FIG. 1. In addition an NTC (negative temperature coefficient) temperature sensor (210A, NTC) may be provided which is shown on the left side on top of the circuit representation but in fact may be part of the first semiconductor module comprising the transistor circuit 210 as it may be important to monitor the temperature of the first semiconductor module in operation of the device.

Figure 3A:
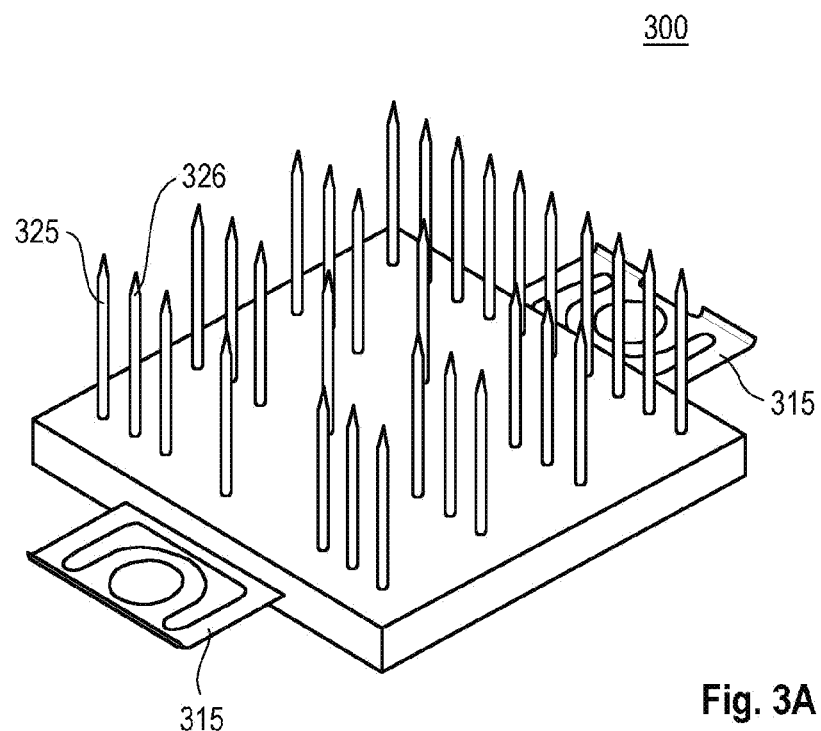
FIGS. 3A and B show a perspective representation (FIG. 3A) and aside view representation (FIG. 3B) of a semiconductor package according to an example.
Figure 3B:
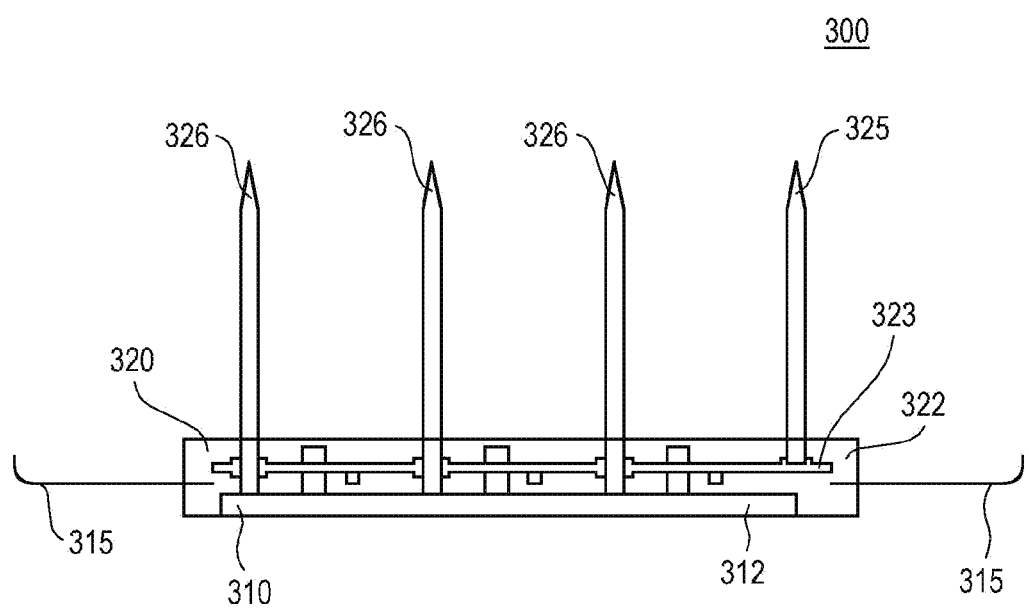

FIGS. 3A and B show an example of a semiconductor package 300 in a perspective view (FIG. 3A) and a cross-sectional side view (FIG. 3B). The perspective view from above shown in FIG. 3A shows a semiconductor package 300 comprising a plurality of metallic pins 325 and 326 extending in an upright direction from an upper surface of the package, i.e. an upper surface of the second encapsulation layer. As already explained in connection with FIG. 1, there are two types of external pins, namely external pins 326 which extend downwards through respective through-connectors in the printed circuit board 323 to the first semiconductor module 310 and which are connected each one with one of the terminals U, V, W, EU, EV, EW or P as shown in FIG. 2. The other type of pins 325 extend downwards to the second semiconductor module 320 to provide power supply and control signals to the semiconductor driver chips of the second semiconductor module 320. In addition two clamps 315 can be provided and attached to opposing side edges of the semiconductor package 300. The clamps 315 may extend into the first or second encapsulation layer 312 or 322 and can be molded within the first or second encapsulation layer 312 or 322. The clamps 315 can be provided for purposes of securing the semiconductor package 300 to a housing or a board. In addition the clamps 315 may serve the purpose of dissipating heat from the semiconductor package 300 to the outside. To this end, the clamps 315 could also be formed such that they do not only extend to a short distance into the encapsulation layer but instead may extend through the complete semiconductor package 300 so that the clamps 315 may be provided by a contiguous or integral punched sheet of a metal. The material of the clamps 315 or the metal sheet may be steel, bronze, or $CuFe_2P$ or any other material which comprises a high heat conductivity.

In the examples of semiconductor packages shown in the figures of this application, the electrical connectors between the first and second semiconductor modules and also from one of the first and second semiconductor modules to the outside have been realized by sleeves with internal metallic pins. It should be noted, however, that the electrical connectors can also be realized in alternative ways. The electrical connectors between the first and second semiconductor modules could also be realized by solder balls or electrically conducting spacers with double-sided solder joints. Also an adhesion connection is possible between the first and second semiconductor modules. For the electrical connectors from the first semiconductor module to the outside electrically conducting spacer elements with double-sided solder joints can be employed, wherein the volume of the solder joints, which is disposed outside of the semiconductor package, may be dimensioned in such a way that either an SMT (surface mounting technique) mounting is possible or another interconnect element can be set upon the solder joint. For the electrical connectors from the second semiconductor module to the outside electrically conducting spacer elements with double-sided solder joints can be employed or a multiple plug can be applied onto the printed circuit board, wherein the contact elements of the multiple plug extend to the outside of the semiconductor package.

In the following, examples of a method for fabricating a semiconductor package will be described. In particular two examples will be presented, one of which is carried out by a molding apparatus comprising a lower mold tool and an upper mold tool and the other one of which is carried out by a molding apparatus comprising only one mold form.

Figure 4:
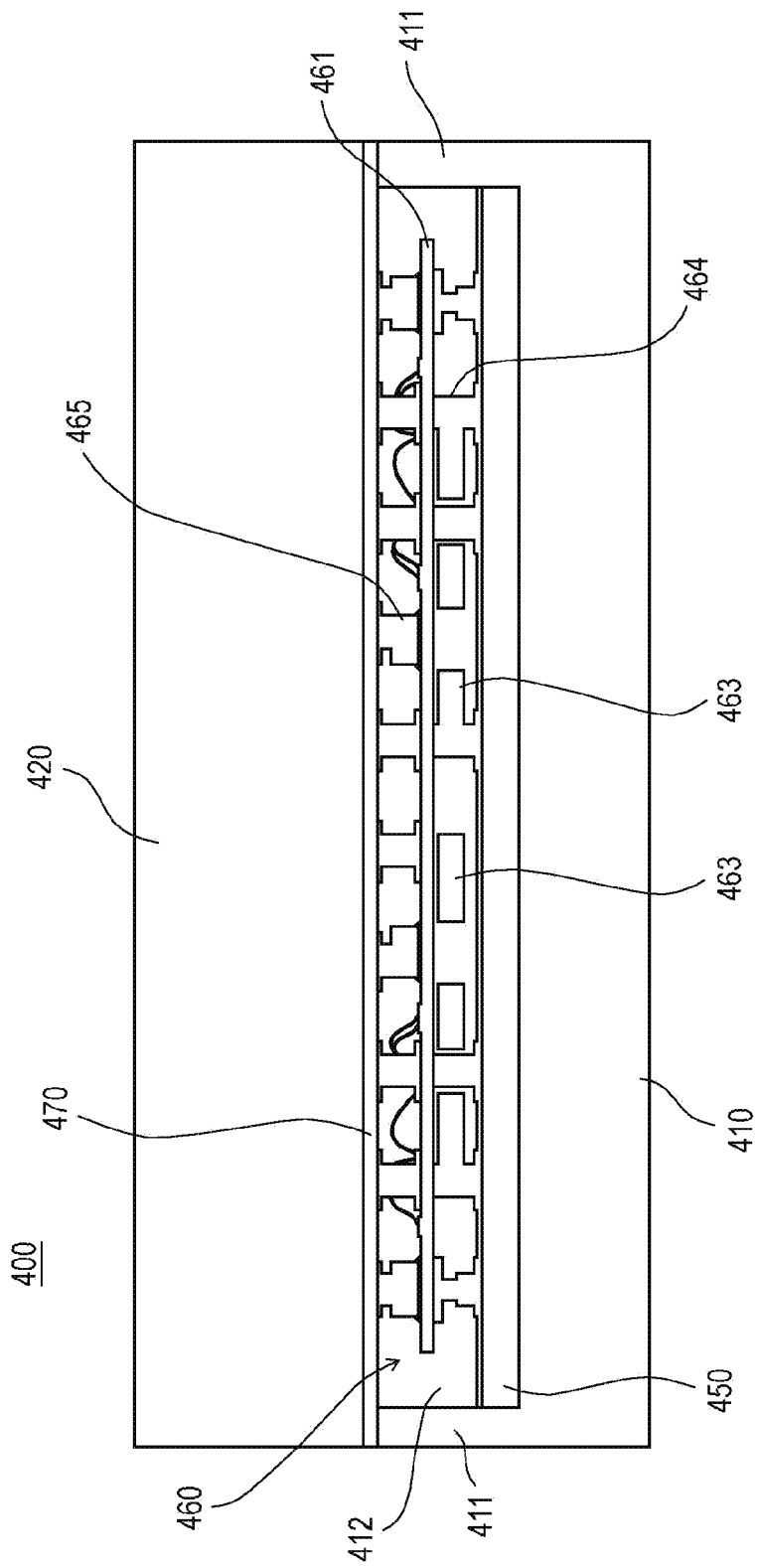
FIG. 4 shows a schematic cross-sectional side view representation for illustrating a method for fabricating a semiconductor package according to an example.

FIG. 4 shows a schematic cross-sectional side view representation for illustrating a method for fabricating a semiconductor package according to an example. The method makes use of a molding apparatus 400 comprising a lower mold tool 410 and an upper mold tool 420, wherein the lower mold tool 410 is formed in such a way that it comprises a depression 412 and an outer circumferential rim 411 so that a hollow space is formed when the upper mold tool 420 is lowered and rests with its lower surface upon the rim 411. At the beginning an assembly is fabricated which comprises a first semiconductor module 450 and a second semiconductor module 460, wherein the second semiconductor module 460 comprises a printed circuit board 461, semiconductor driver chips (not shown) and passive electric devices 463 each connected to the printed circuit board 461, and sleeves 464 connecting a lower surface of the printed circuit board 461 with the first semiconductor module 450, and sleeves 465 connected to an upper surface of the printed circuit board 461 and extending in an upright direction. An assembly, as it was described before, is inserted into the depression 412 of the lower mold tool 410. Then the upper mold tool 420 is moved downwards until a lower surface of the upper mold tool 420 rests upon an upper surface of the rim 411 of the lower mold tool 410. A foil 470 is inserted in the space between the lower surface of the upper mold tool 420 and the upper surface of the rim 411 of the lower mold tool 410 and the upper surfaces of the upper sleeves 465 in order to seal the upper sleeves 465 to the outside. Then the cavity with the assembly arranged inside is filled by transfer molding with an encapsulating material as it was specified above. After curing or hardening of the encapsulation material the finished semiconductor package can be taken out of the molding apparatus.

Figure 5:
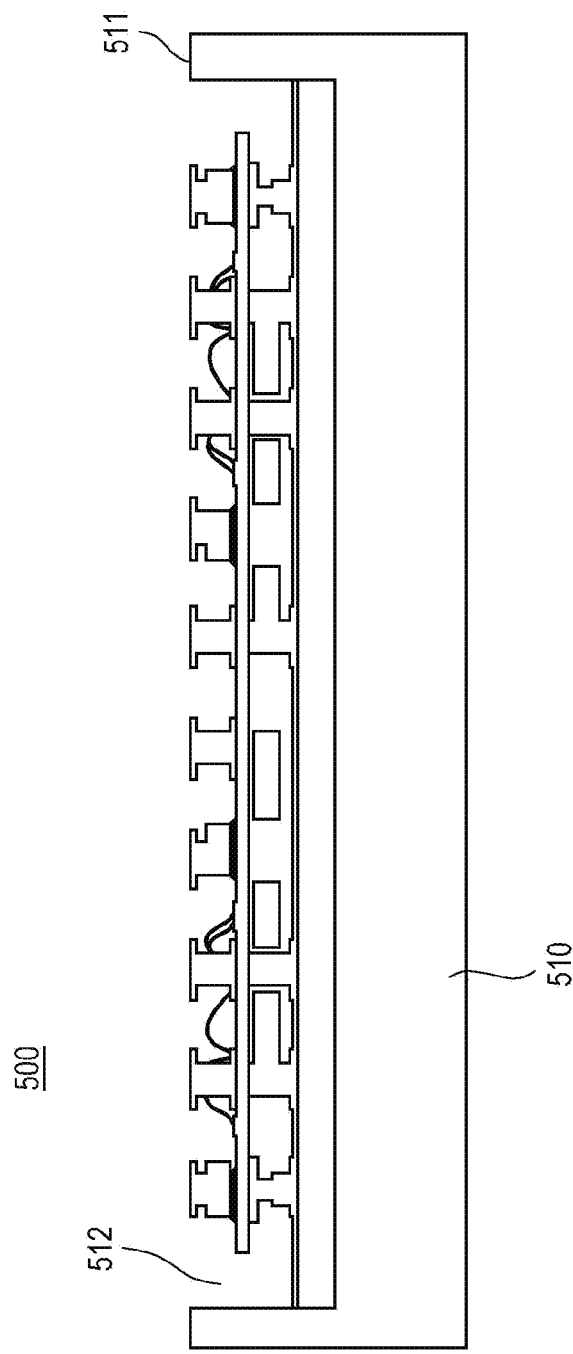
FIG. 5 shows a schematic cross-sectional side view representation for illustrating a method for fabricating a semiconductor package according to an example.

FIG. 5 shows a schematic cross-sectional side view representation for illustrating an example of a method for fabricating a semiconductor package. The method makes use of a molding apparatus 500 which comprises one mold form 510 which may be shaped in a similar way as the lower mold form 410 of the apparatus 400 of FIG. 4. A prefabricated assembly, as it was described before in connection with FIG. 4, is inserted into the depression 512 of the mold form 510. Afterwards an encapsulation material is filled into the depression 512 of the mold form 510 until the upper surface of the rim 511 is reached. In order to prevent the encapsulation material flowing into the hollow upper sleeves 465, the metallic pins could be inserted into the upper sleeves 465 before filling the encapsulation material into the depression 512 of the mold form 510.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A semiconductor package, comprising:
    a substrate comprising an insulating layer, a first metallic layer disposed on a first main surface of the insulating layer and a second metallic layer disposed on an opposing second main surface of the insulating layer;
    semiconductor transistor chips arranged on the first metallic layer such that first main faces of the semiconductor transistor chips face away from the first metallic layer;
    a first encapsulation body encapsulating the substrate and the semiconductor transistor chips, wherein a first surface of the first encapsulation body is arranged above the first main faces of the semiconductor transistor chips;
    a metallization layer arranged on the first surface of the first encapsulation body and electrically connected to the semiconductor transistor chips by via connections extending through the first encapsulation body;
    a printed circuit board arranged above the metallization layer;
    a plurality of semiconductor driver chips arranged on the printed circuit board and electrically connected to the printed circuit board;
    a second encapsulation body encapsulating the first encapsulation body, the metallization layer and the printed circuit board and further being disposed in an intermediate space between the printed circuit board and the metallization layer; and
    metallic pins electrically connecting the semiconductor transistor chips to the semiconductor driver chips,
    wherein the metallic pins are arranged in sleeves and wherein the sleeves are encapsulated by the second encapsulation body, and
    wherein the semiconductor package comprises an AC/AC converter circuit, or an AC/DC converter circuit, or a DC/AC converter circuit, or a frequency converter, or a DC/DC converter circuit.

2. The semiconductor package according to claim 1, wherein
    the substrate comprises a carrier.

3. The semiconductor package according to claim 2, wherein
    the carrier comprises one or more of a direct copper bonded substrate, a direct aluminum bonded substrate, and an active metal brazing substrate, wherein the substrate comprises a ceramic layer or a dielectric layer.

4. The semiconductor package according to claim 2, wherein
    the carrier comprises a first upper surface, a second lower surface opposite to the first upper surface, and side faces connecting the first and second surfaces, wherein the first encapsulation body covers the first upper surface and the side faces of the carrier.

5. The semiconductor package according to claim 1, wherein the semiconductor package further comprises a plurality of semiconductor diode chips, and wherein each one of the semiconductor transistor chips is connected with one of the semiconductor diode chips in parallel.

6. The semiconductor package according to claim 1, wherein the semiconductor package further comprises a plurality of semiconductor diode chips, and wherein the via connections connect the metallization layer with selected ones of the semiconductor transistor chips and the semiconductor diode chips.

7. The semiconductor package according to claim 6, wherein
the via connections comprise lateral diameters greater than 50 µm.

8. The semiconductor package according to claim 1, wherein the semiconductor package further comprises a plurality of semiconductor diode chips, and wherein the semiconductor transistor chips and the semiconductor diode chips are connected.

9. The semiconductor package according to claim 1, wherein
the printed circuit board is completely embedded in the second encapsulation body.

10. The semiconductor package according to claim 1, wherein
the first encapsulation body and the second encapsulation body are made of different materials.

11. The semiconductor package according to claim 1, wherein
the semiconductor package comprises at least one half-bridge circuit, wherein in each half-bridge circuit two of the semiconductor transistor chips are connected in series.

12. The semiconductor package of claim 1, wherein at least a first sleeve of the sleeves is arranged in the second encapsulation body such that it is surrounded laterally on all sides by the second encapsulation body and wherein at least a second sleeve of the sleeves is arranged in the second encapsulation body such that it is exposed at a first surface of the second encapsulation body.

13. A semiconductor package, comprising:
a substrate comprising an insulating layer, a first metallic layer disposed on a first main surface of the insulating layer, a second metallic layer disposed on an opposing second main surface of the insulating layer and side faces connecting the first and second main surfaces;
semiconductor transistor chips arranged on the first metallic layer such that first main faces of the semiconductor transistor chips face away from the first metallic layer;
a first encapsulation body encapsulating the substrate on the first surface and the side faces, wherein the first encapsulation body also encapsulates the semiconductor transistor chips, and wherein a first surface of the first encapsulation body is arranged above the first main faces of the semiconductor transistor chips;
a metallization layer arranged on the first surface of the first encapsulation body and electrically connected to the semiconductor transistor chips by via connections extending through the first encapsulation body;
a semiconductor driver module comprising a plurality of semiconductor driver chips;
a second encapsulation body encapsulating the first encapsulation body, the metallization layer and the semiconductor driver module; and
metallic pins electrically connecting the semiconductor transistor chips to the semiconductor driver chips,
wherein the metallic pins are arranged in sleeves and wherein the sleeves are encapsulated by the second encapsulation body, and
wherein the second surface of the substrate, a second surface of the first encapsulation body and a second surface of the second encapsulation body are coplanar.

* * * * *